(12) United States Patent
Tripsas et al.

(10) Patent No.: US 6,977,389 B2
(45) Date of Patent: Dec. 20, 2005

(54) PLANAR POLYMER MEMORY DEVICE

(75) Inventors: Nicholas H. Tripsas, San Jose, CA (US); Matthew S. Buynoski, Palo Alto, CA (US); Uzodinma Okoroanyanwu, Mountain View, CA (US); Suzette K. Pangrle, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/452,877

(22) Filed: Jun. 2, 2003

(65) Prior Publication Data

US 2004/0238864 A1   Dec. 2, 2004

(51) Int. Cl.$^7$ ................................. H01L 35/24
(52) U.S. Cl. ........................ 257/40; 257/296
(58) Field of Search .................... 257/40, 296

(56) References Cited

U.S. PATENT DOCUMENTS

| | | | |
|---|---|---|---|
| 3,685,028 A | 8/1972 | Wakabayashi et al. | |
| 4,663,270 A | 5/1987 | Potember et al. | |
| 5,589,692 A | 12/1996 | Reed | |
| 5,953,628 A * | 9/1999 | Kawaguchi | 438/635 |
| 6,055,180 A | 4/2000 | Gudesen et al. | |
| 6,272,038 B1 | 8/2001 | Clausen et al. | |
| 6,314,019 B1 | 11/2001 | Kuckes et al. | |
| 6,320,200 B1 | 11/2001 | Reed et al. | |
| 6,324,091 B1 | 11/2001 | Gryko et al. | |
| 6,326,640 B1 * | 12/2001 | Shi et al. | 257/40 |
| 6,348,700 B1 | 2/2002 | Ellenbogan et al. | |
| 6,395,642 B1 * | 5/2002 | Liu et al. | 438/720 |
| 6,452,207 B1 * | 9/2002 | Bao | 257/40 |
| 6,541,816 B2 | 4/2003 | Ramsbey et al. | |
| 6,555,436 B2 | 4/2003 | Ramsbey et al. | |
| 6,740,900 B2 * | 5/2004 | Hirai | 257/40 |
| 2003/0020088 A1 | 1/2003 | Seo et al. | |

FOREIGN PATENT DOCUMENTS

WO   WO 02/37500   5/2002

OTHER PUBLICATIONS

Hoshino, et al., Device Performance of an N-Channel Organic Thin-Film Transistor with Lif/Al Bilayer Source and Drain Electrodes, Jul. 1, 2002, vol. 41 pp. 808-810, Japan.

Kollopoulou, et al., A Multi-Stack Insulator Silicon-Organic Memory Device with Gold Nanoparticles, Sep. 16, 2003, pp. 477-480, Portugal.

(Continued)

Primary Examiner—Sara Crane
(74) Attorney, Agent, or Firm—Amin & Turocy, LLP

(57) ABSTRACT

The present invention provides a planar polymer memory device that can operate as a non-volatile memory device. A planar polymer memory device can be formed with two or more electrodes and an electrode extension associated with one electrode, wherein a selectively conductive medium and dielectric separate the electrodes. The method for forming a planar polymer memory device comprises at least one of forming a first electrode with an associated plug, forming a second electrode, forming a passive layer over the extension, depositing an organic polymer and patterning the organic polymer. The method affords integration of a planar polymer memory device into a semiconductor fabrication process. A thin film diode (TFD) can further be employed with a planar polymer memory device to facilitate programming. The TFD can be formed between the first electrode and the selectively conductive medium or the second electrode and the selectively conductive medium.

28 Claims, 15 Drawing Sheets

OTHER PUBLICATIONS

Dimitrakopoulos, et al., Organic Thin-Film Transistors: A Review of Recent Advances, Jan. 1, 2001, pp. 11-27, United States.

International Search Report, PCT/US04/014696, Sep. 6, 2004.

* cited by examiner

PLANAR POLYMER MEMORY DEVICE

FIELD OF INVENTION

The present invention relates generally to organic memory devices and, in particular, to planar polymer memory devices.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid-state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances, which are much smaller than the small minimum size, for example, one quarter the minimum size.

Scaling inorganic solid-state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Furthermore, applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage for inorganic non-volatile memory devices while meeting increased performance demands is particularly difficult, especially while maintaining low costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates to systems and methods for fabricating planar polymer (e.g., organic semiconductor) memory devices. Organic memory devices are provided that can store information within an organic material formed within the device. The memory devices include at least a first and a second electrode, the organic material and a passive layer deposited over one of the electrodes. A portion of the electrode associated with the passive layer and the other electrode can be formed within a dielectric layer, wherein the organic material can then be formed over the electrodes and dielectric layer to operatively couple the electrodes in a substantially parallel process and planar manner.

The methods facilitate integrating a process to construct a planar polymer memory device with that of a semiconductor process. An organic memory device is provided having an organic semiconductor layer to store information and a passive layer operative with the organic semiconductor layer to facilitate storage of the information. A first electrode and a second electrode can be collectively positioned above or below the organic semiconductor layer. Thus, the process can be utilized to efficiently fabricate a planar polymer memory device and a semiconductor device in a concurrent manner, saving time and reducing cost.

In addition, a thin film diode (TFD) or similar asymmetric blocking device can be integrated within planar polymer memory devices to facilitate programming of the semiconducting storage material. The TFD, for example, can form a voltage/current-controlled isolation barrier between respective memory structures. The memory cells are activated by applying threshold voltages to the component (e.g., forward diode voltage, reverse zener breakdown voltage), and applying voltages to underlying passive and conductive layers within the memory structure, wherein bits can be stored in the form of a 0, 1 or other intermediate impedance state within the selected portions or the memory structure.

Another aspect of the present invention relates to systems and methods for fabricating multi-layer organic semiconductor memory devices. Multi-level organic memory structures are provided that can store information within organic material associated with the structures. Such memory structures include a plurality of electrodes, the organic material and a passive layer associated with one of the electrodes. The organic memory structures can be formed in a vertical arrangement, wherein two or more organic memory devices are variously positioned relative to an electrode. In addition, a plurality of vertically arranged stacks can be formed in parallel thus facilitating construction of high-density memory devices, having multiple layers of vertically arranged memory cells, and providing high-speed parallel access to the respective cells. In this manner, memory device utilization, density, and packing can be substantially improved.

The present invention provides organic memory devices that possess at least one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

To the accomplishment of the foregoing and related ends, the invention comprises the features hereinafter fully described and particularly pointed out in the claims. The following description and the annexed drawings set forth in detail certain illustrative aspects and implementations of the invention. However, these are indicative of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention provides a planar polymer memory device that can operate as a non-volatile memory device. A single cell memory component can be constructed with two or more electrodes, an electrode extension associated with at least one electrode, a passive layer, a selectively conductive medium operatively coupled to form an individual memory cell, and optionally a partitioning layer to facilitate programming and/or isolate memory cell layers.

By applying various bias voltages across the two or more electrodes, an impedance state for the memory cell can be stored within the selectively conductive medium. The impedance state can be read by applying a current, and then measuring the impedance state of the selectively conductive medium. The impedance state of the selectively conductive medium represents one or more bits of information, and does not require a persistent power supply or refresh power cycles to retain or maintain a stored impedance state.

The method comprises forming a bit line within a dielectric layer. Subsequently, a conductive plug (e.g., extension) associated with the bit line and a word line can be individually formed, serially and/or concurrently, within a dielectric layer formed over the bit line. The conductive plug is formed such that the conductive plug and the bit line are operatively coupled. A passive material is typically formed over the conductive plug associated with the bit line to facilitate access between the conductive plug and a selectively conductive medium. The selectively conductive medium is formed over the passive material and the word line. An optional partitioning component can be formed within various locations of the memory cell. For example, the partitioning component can be formed adjacent to the first electrode and/or adjacent to the second electrode.

Figure 1:
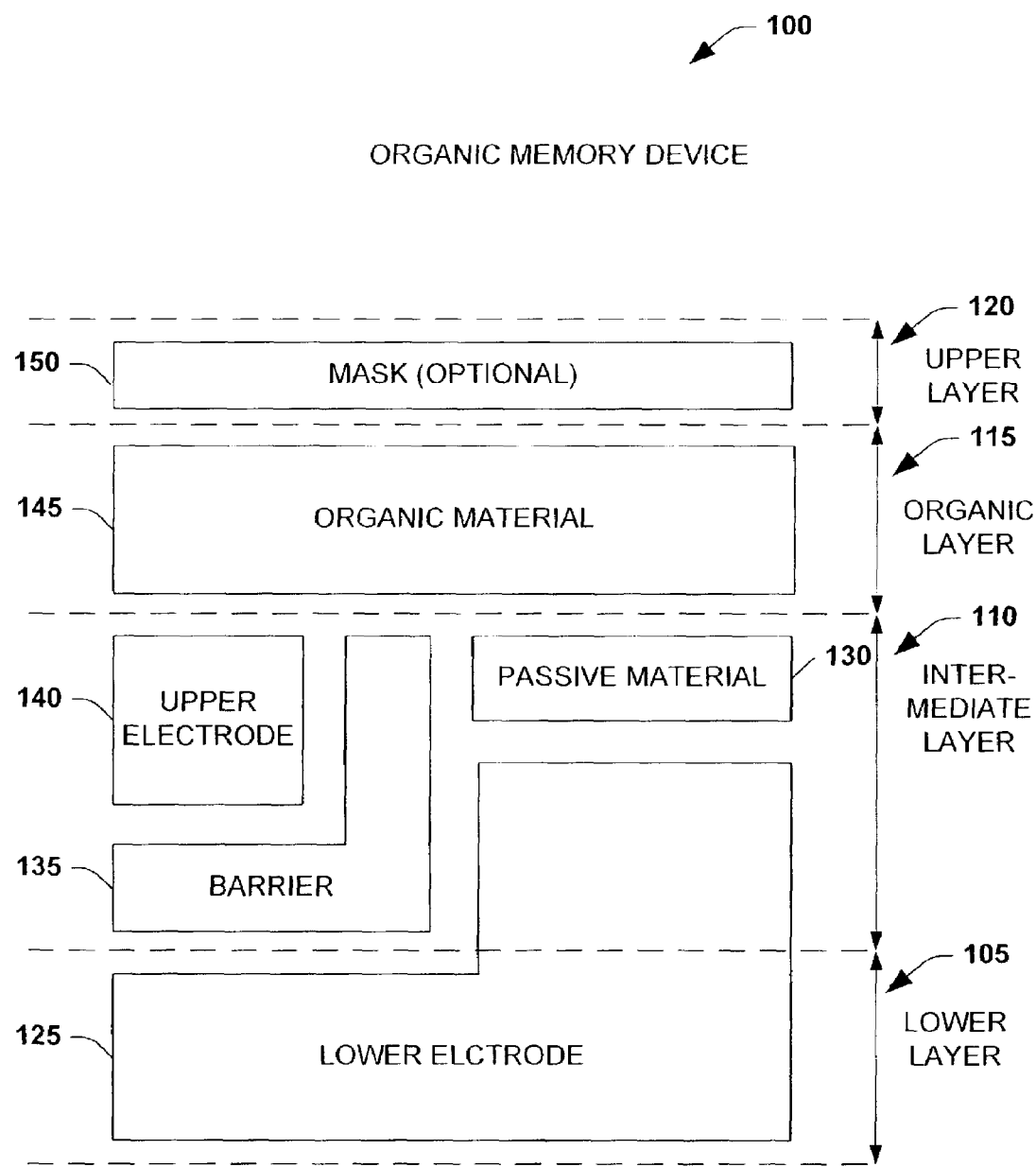
FIG. 1 is a block diagram illustrating exemplary layers and structures of a memory device in accordance with an aspect of the present invention.

Referring initially to FIG. 1, a block diagram of exemplary layers and structures of an organic memory device (e.g., a planar polymer memory device) is illustrated in accordance with the present invention. In one aspect, an organic memory device can be represented as one or more layers wherein a layer provides functionality and/or a medium for a structure(s) that provides functionality (e.g., a conductive, a semi-conductive and a non-conductive capability) that contributes to the ability to employ an organic memory device as a memory cell(s).

For example, an organic memory device 100 includes a lower layer 105, an intermediate layer 110, an organic layer 15 and, optionally, an upper layer 120. The lower layer 105 typically is the bottom or first layer of an organic memory device; that is, another layer in accordance with the organic memory device 110 can be built over the lower layer 105 and/or over a layer subsequent to the lower layer 105. The lower layer 105 can include one or more structures such as a dielectric(s) and an electrode(s) as will be discussed in detail below, and generally is associated with an electrode of the organic memory device 100.

The intermediate layer 110 is depicted as a continuation of the lower layer 105. However, it can be appreciated that a barrier(s) (e.g., air) can exist between the intermediate layer 110 and the lower layer 105, as well as between the other layers. The intermediate layer 110 is typically utilized to facilitate interaction (e.g., electrical) between the lower layer 105 and additional layers. The organic layer 115, interfaced with an optional upper layer 120, is illustrated above the intermediate layer 110 such that it resides between the intermediate layer 110 and the upper layer 120. Generally, the organic layer 115 encompasses the memory storage functionality of the organic memory device 100. Like the lower layer 105, one or more structures can be formed within the intermediate layer 110, the organic layer 115 and the optional upper layer 120.

It is to be appreciated that although various exemplary layers are illustrated with the organic memory device 100, more or less layers may be formed and/or provided in accordance with the present invention. For example, partitioning layers and/or combinations of layers that cooperate to form memory structures in accordance with the present invention can be employed. In addition, the layers are portrayed as individually stacked in a horizontal and parallel configuration (i.e., one layer on top of another layer). However, it can be appreciated that a layer can be formed, for example, perpendicular and/or diagonal to another layer, in a combination of various vertical, horizontal, diagonal and curved arrangements, within a layer, and/or intersecting such that a portion of a layer may protrude into one or more other layers. In accordance with various configurations described, various geometric patterns can be employed for the layers. For example, a layer can be shaped as a rectangle (as shown), an ellipse, a circle, a pyramid, a hexagon, and the like.

As intimated supra, an organic memory device can include one or more structures. For example, the organic memory device 100 comprises a lower electrode 125, a passive material 130, a barrier 135, an upper electrode 140, an organic material 145 and, optionally, a mask 150, wherein the structures are positioned to operate as a memory cell as described below.

The lower electrode 125 provides a conductive medium whereby a current can be induced (e.g., electrically, magnetically and electro-magnetically) to flow between the lower electrode 125 and at least one other conductive medium. As depicted, the lower electrode 125 can be "L" shaped and resides within more than one layer. However, it is to be appreciated that the shape and location of the lower electrode 125 is not so limited. Additionally, the lower electrode 125 and the other structures can exist within and/or across layers (e.g., intermediate layer 110).

Commonly, a portion of a surface of the lower electrode 125 is exposed to an element such as a passive material 130 to facilitate interaction between the lower electrode 125 and a semiconductor material. A barrier 135 can be formed, if necessary, to isolate or insulate the lower electrode 125 and the passive material 130 from an upper electrode 140. Typical barriers include dielectric properties and attributes. The upper electrode 140 provides a second conductive medium wherein an electrical current can flow through an electrical path from one conductive medium to another conductive medium, for example from the lower electrode 125 to the upper electrode 140 through the passive material 130 and the organic material 145.

The storage element of the organic memory device 100 is the organic material 145, wherein the organic material 145 is formed such that it at least contacts the passive material 130 on the surface of the lower electrode 125 and the upper electrode 140. Additionally, it can extend over the barrier 135. The organic material 145 can include an optional mask 150 on an exposed surface that can be utilized for patterning.

The shapes, sizes and placement of the structures are not intended to limit the invention, but rather to provide an example to illustrate an aspect of the invention. Additionally, more or less components can be included, for example a thin film diode can be integrated as discussed in detail below. For brevity, the different configurations of structures will not be presented, however it can be appreciated that at least the shapes, sizes, configurations and arrangements discussed above regarding the layers are applicable to the structures.

Figure 2:
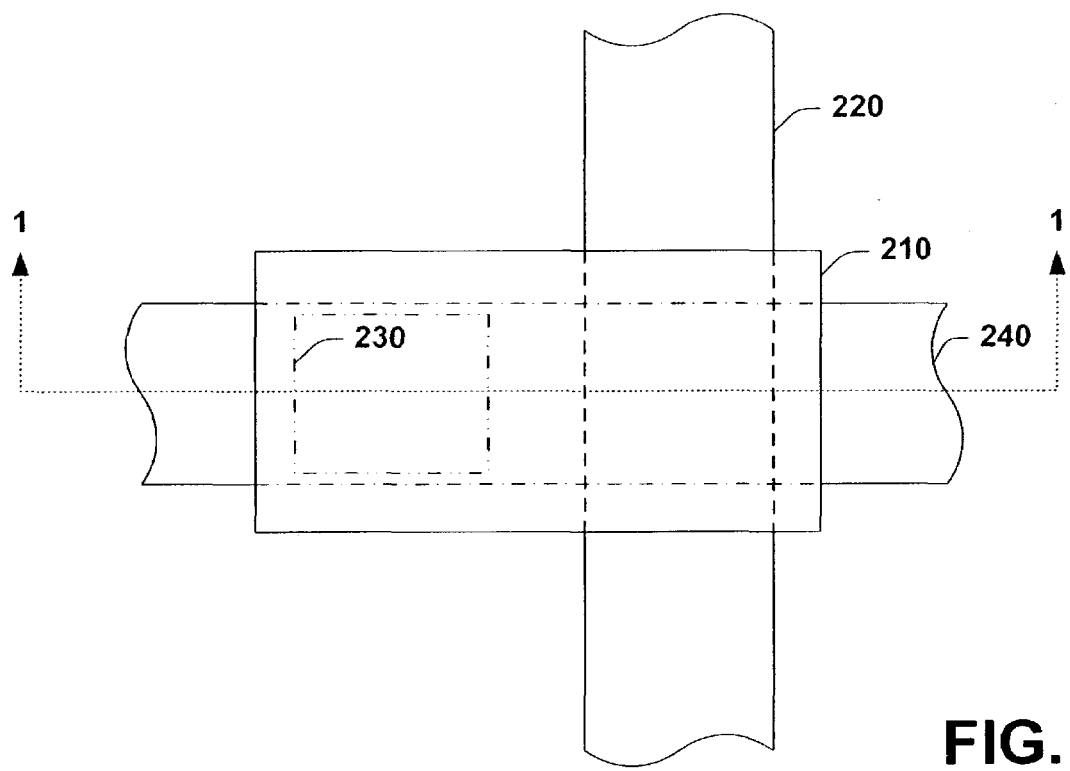
FIG. 2 is a top view of a basic single cell memory device in accordance with an aspect of the present invention.

Turning to FIG. 2, a top view of an organic memory device 200 is illustrated in accordance with an aspect of the present invention. The organic memory device 200 is a three-dimensional volume of a plurality of layers and structures within layers (e.g., the layers and structures described in FIG. 1). As viewed from the top, the plurality of layers and structures become superimposed into a two-dimensional plane.

For clarity, a top-most layer and/or an immediately visible structure is depicted with a solid line and an internal or overlapped layer and structure is depicted with a dashed and dotted-dashed line. A dotted line is also provided that corresponds to a cross sectional view (reference line 1—1) associated with FIG. 3.

Assuming an optional top coating has not been deposited, the uppermost structure is an organic material 210. Similar to the organic material of FIG. 1, the organic material 210 is applied such that it at least contacts an upper electrode and a passive material that is typically deposited on a lower electrode. This can be observed as the organic material 210 covering an upper electrode 220 and a passive material 230. Generally, only a portion of the upper electrode 220 is covered (as shown). It can be appreciated that the upper electrode 220 extends beyond the organic memory device 200 to a finite length where it can be further utilized in conjunction with another organic memory device(s) to create an additional memory storage cell(s) as will be discussed in detail below.

Unlike the upper electrode 220, a passive material 230 is usually encapsulated by the organic material 210 and any other material that supports and/or houses it. Due to superposition, the passive material 230 appears to reside within a lower electrode 240, however the doted-dashed line representing the passive material 230 designates that it is an underlying structure. As noted supra, the passive material 230 typically is applied to a surface of the lower electrode 240. Structural orientations within organic memory device 200 will become more apparent with the explanation of a cross sectional view of organic memory device 200 provided below.

Similar to the upper electrode 220, the lower electrode 240 has a finite length that extends beyond the organic memory device 200, and which can be employed in an additional organic memory device(s). As illustrated, the lower electrode 240 is perpendicular to the upper electrode 220, however it can be appreciated that other orientations can be employed. For example, the lower electrode 240 and the upper electrode 220 can run parallel to each other or at an angle suitable for a particular application.

Figure 3:
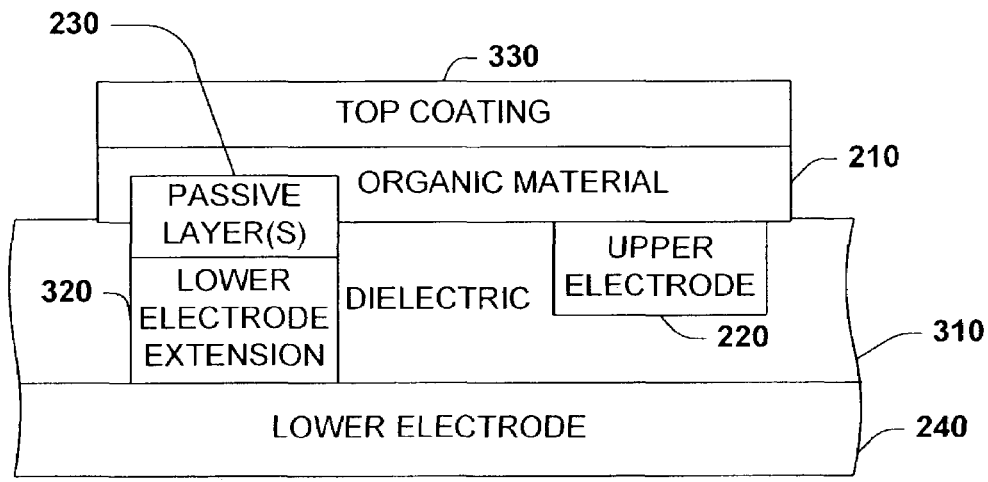
FIG. 3 is a first cross sectional cut-away view of a portion of a planar polymer memory device in accordance with an aspect of the present invention.

FIG. 3 illustrates a cross-sectional view of the organic memory device 200 along line 1—1 as shown in FIG. 2 (hereafter organic memory device 300) in accordance with an aspect of the subject invention. The organic memory device 300 includes the organic material 210, the upper electrode 220, the passive material 230 and the lower electrode 240 as described above. The organic memory device 300 further includes a dielectric 310, a lower electrode extension 320 and an optional top coating 330.

The lower electrode 240 is the bottom structure, or the foundation, from which the other structures are built on. Adjacent to the lower electrode is the dielectric 310 and the lower electrode extension 330. In one aspect of the present invention, the dielectric 310 is first formed over the lower electrode 240. Then, a portion of the dielectric 310 is removed, employing a suitable dielectric removal technique, such that a surface of the lower electrode 240 is exposed. The lower electrode extension 320 is then formed within the volume created by the removal of the dielectric 310 where it operatively contacts the lower electrode 240. The material utilized to form the lower electrode extension 320 can be the same or a similar material as used for the lower electrode. Suitable materials include materials with like attributes and characteristics (e.g., electrical, mechanical and chemical) that preferably do not degrade or compromise the integrity of the memory device.

In another aspect of the invention, the lower electrode 240 is initially formed with an extension (e.g., the lower electrode of FIG. 1). For this aspect, the lower electrode extension may or may not be formed. That is, if the formed extension of the lower electrode 240 suffices, then the lower electrode extension 320 need not be formed. However, if the formed extension of the lower electrode 240 does not satisfy the architectural design because further extension is necessary, then the lower electrode extension 320 can be formed. A bare surface (e.g., not covered by a material such as the dielectric 310 or the lower electrode 240) of the lower electrode 240 or the lower electrode extension 320 can be exposed to the passive material 230.

The dielectric 310 formed over the lower electrode 240 can be an inter layer dielectric (ILD), for example a semiconductor material and/or substantially any type of material having dielectric properties. Above the dielectric layer 310, the organic material 210 (e.g., semiconductor material and polymer) is formed. Formation of the organic material 210 occurs such that the organic material 210 covers the passive layer 230 and the upper electrode 220, establishing a selectively activated electrical path from the lower electrode 240 to the upper electrode 220, and vice-versa. An optional top coating 340 (e.g., a resist or an antireflective material) can then deposited on the organic material 210 and patterned (e.g., through etching).

As an example, the organic memory device 300 may be employed as a memory cell. Applying an activation voltage (e.g., a voltage that actives that conductive properties of the organic material 210) across the lower electrode 240 and the upper electrode 220 allows current to flow from the lower electrode 240, through the lower electrode extension 320, the passive material 230 and the organic material 210, to the upper electrode 220. A storage state (e.g., 1, 0, other impedance state) can then be stored in the organic memory device 300 or read from the organic memory device 300.

Figure 4:
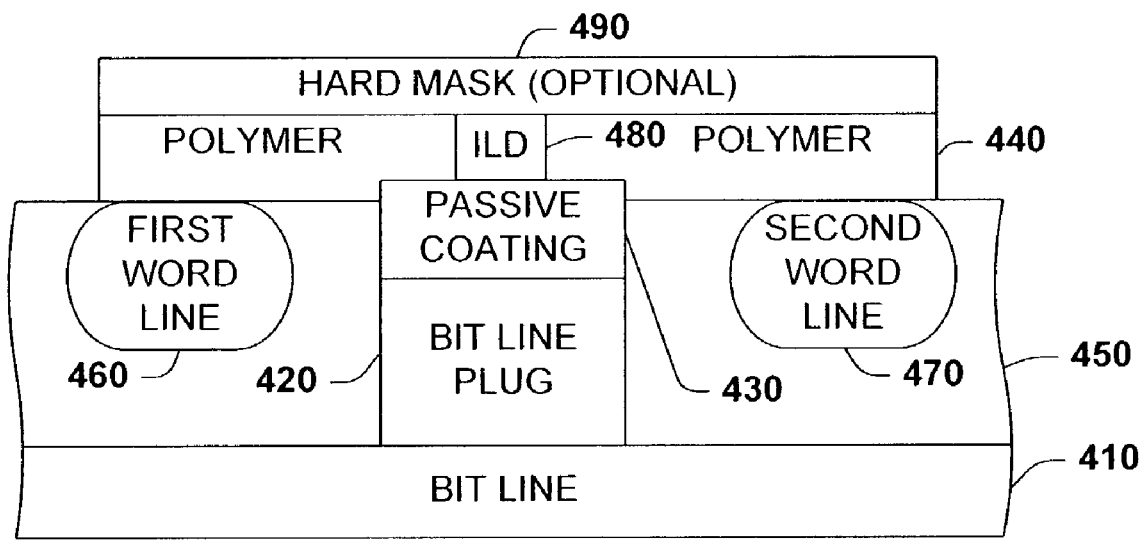
FIG. 4 is a second cross sectional cut-away view of a portion of a planar polymer memory device in accordance with an aspect of the present invention.

FIG. 4 illustrates a cross-sectional view (similar to line 1—1 of FIG. 2) of a dual cell organic memory device (memory device) 400 in accordance with an aspect of the present invention. It is to be appreciated that a quad cell or other multiple cell memory devices could be constructed in a like manner. In addition, a plurality of such devices can be manufactured in accordance with an Integrated Circuit (IC) memory device (e.g., 1 Mbit, 2 Mbit, 8 Mbit storage cells, . . . and so forth, constructed as a non-volatile memory IC).

Memory device 400 includes a bit line 410 (e.g., copper (Cu) or other conductive medium) with a bit line plug 420 (e.g., Cu or other conductive medium) therein attached. The bit plug 420 can be a part of, integrated with or interfaced to the bit line 410. Deposited on a top surface of the bit plug 420 is a passive coating 430 (e.g., $Cu_2S$ or the like) that facilitates access between the bit plug 420 and a polymer 440 (e.g., semiconductor material). Above the bit line 410 is an inter layer dielectric (ILD) 450 in which the bit plug 420 and the passive coating 430 have been formed within.

A first memory cell can be constructed by forming a first word line 460 within the ILD 450, and interfacing the first word line 460 to the passive coating 430 with the polymer 440. The first word line 460 can be formed by removing a first section of the ILD 450 such that the first word line 460 can be embedded within the ILD 450. The first word line 460 is then formed within the ILD 450.

A second memory cell can be serially and/or concurrently constructed with the first memory cell. Formation of the second memory cell can comprise forming a second word line 470 within the ILD 450, and interfacing the second word line 470 to the passive coating 430 with the polymer 440. The second word line 470 is formed by removing a second section of the ILD 450, and embedding the second word line 470 within the ILD 450.

An ILD 480 is subsequently formed over the passive coating 430, the ILD 450, the first word line 460 and the second word line 470. A first opening is formed in the ILD 480 to expose a first portion of the passive coating 430 and the first word line 460. A second opening is serially and/or concurrently formed in the ILD 480. The second opening is isolated from the first opening via the ILD 480 and formed to expose a second portion of the passive coating 430 and the second word line 470.

After formation of the first opening and the second opening, the polymer 440 can be formed within the first and second openings, and over the first word line 460 and the first portion of the passive coating 430 to form the first memory cell, and over the second word line 470 and the second portion of the passive coating 430 to form the second memory cell. Then, an optional a hard mask 490 can be deposited (e.g., spun-on) over the ILD 480 and the polymer 440.

It is to be appreciated that the memory device 400 is an example in accordance with an aspect of the present invention and does not limit the invention. For example, the description provided above includes three ILD layers, however fewer or greater numbers of ILD layers can be employed. In addition, several passive coatings may be utilized. Furthermore, the shapes and orientations of the openings where the polymers were formed may be different. Moreover, the first and second polymers may be the same or similar materials. Likewise, the ILDs may be the same or similar material.

Figure 5:
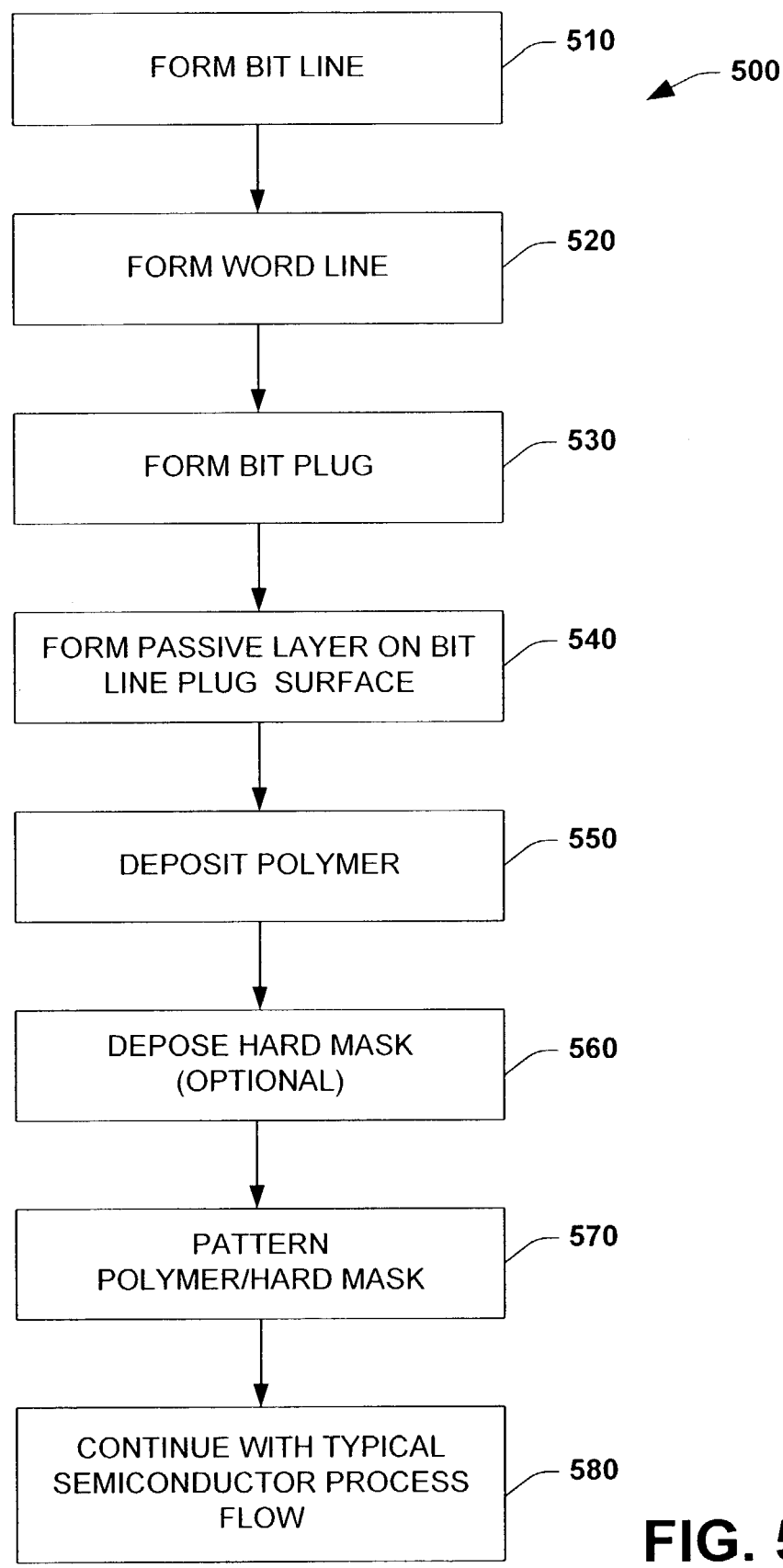
FIG. 5 illustrates an exemplary methodology of a portion of a process to fabricated planar polymer memory devices in accordance with an aspect of the present invention.

Turning to FIG. 5, a methodology 500 to integrate fabrication of a planar polymer memory device into a semiconductor process is illustrated in accordance with the present invention. While, for purposes of simplicity of explanation, the methodologies may be shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention Proceeding to 510, a bit line (e.g., lower electrode) is formed in accordance with a single or dual damascene process as is well understood. Moving to 520, a word line (e.g., upper electrode) is formed in a similar manner (e.g., single or dual damascene). At 530, a bit plug can also be formed in accordance with a single or dual damascene. Then at 540, a passive layer is applied to the surface of the bit plug.

Next, at 550, a polymer (or other organic material) is deposited over(e.g., spun on) the surface such that it encapsulates the passive layer and the word line. The organic material can be etched back, if necessary, in accordance with a surface planarization process or chemical mechanical polish (CMP) process as is well understood. At 560, and optional hard mask can be deposited over the polymer. Then at 570 a pattern can be etched on either the hard mask, if employed, or the polymer. At 580, the processing steps for a semiconductor process, as known, can be employed to complete fabrication.

Figure 6:
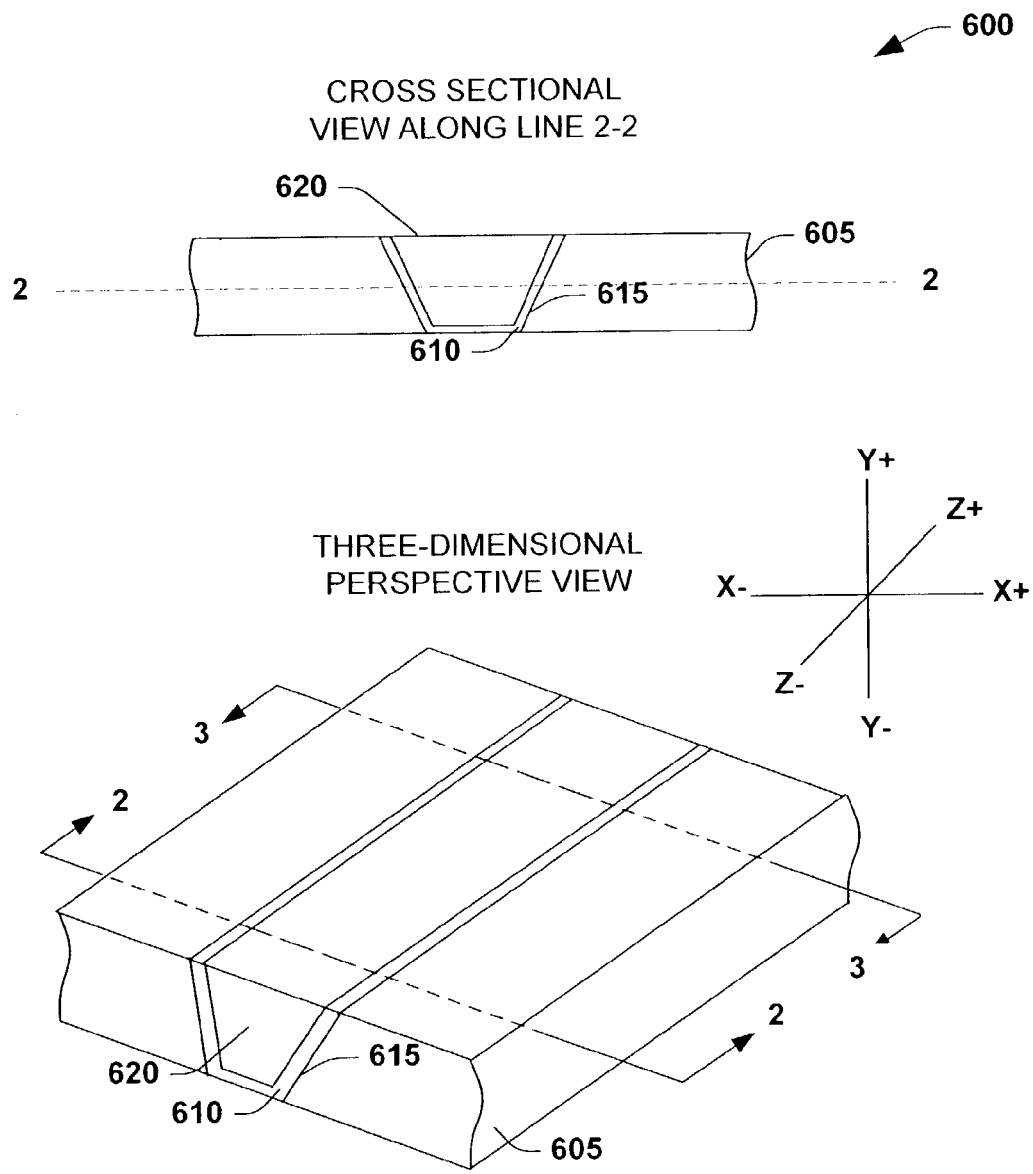
FIG. 6 provides a three-dimensional view and planar views of the formation of a bottom layer of a memory device in accordance with an aspect of the present invention.
Figure 6:
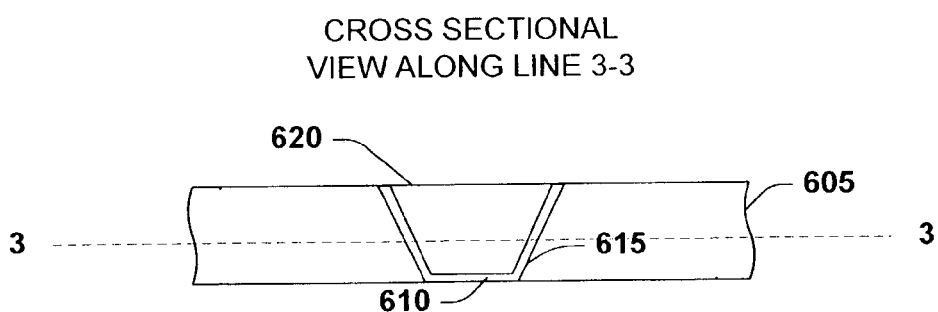
Figure 7:
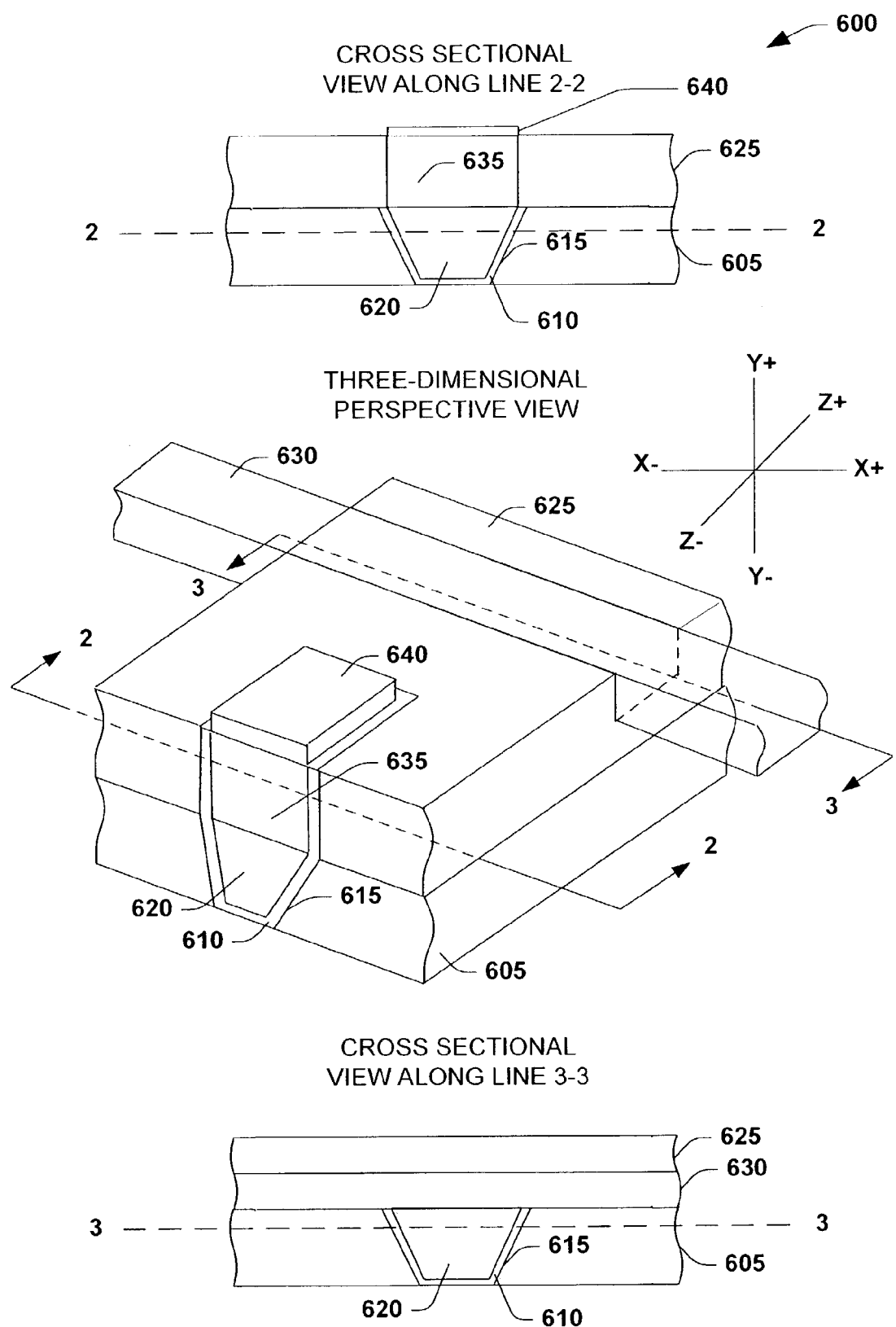
FIG. 7 is a continuation of FIG. 6, wherein the formation of a second layer of a memory device is illustrated.
Figure 8:
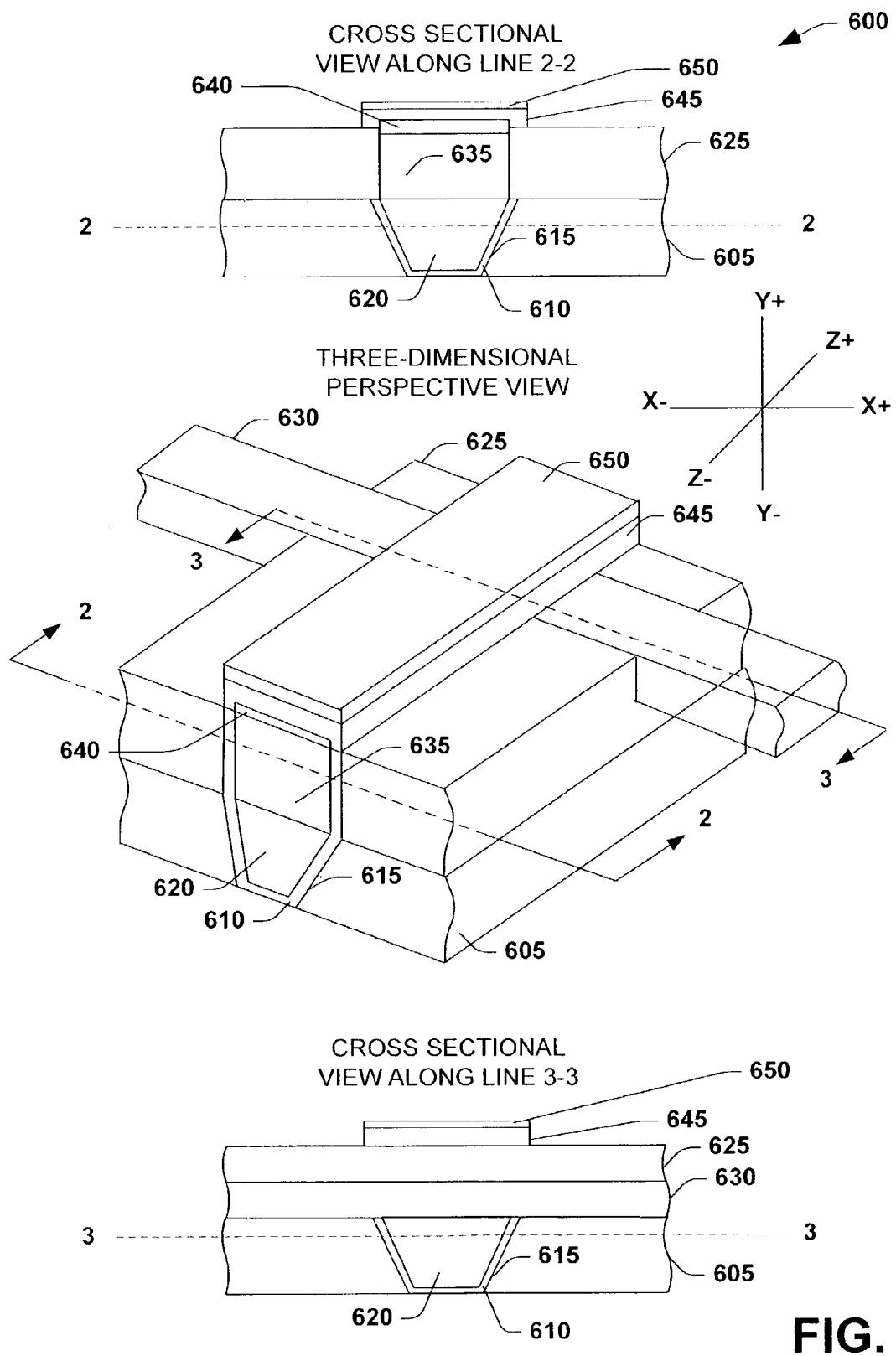
FIG. 8 is a continuation of FIG. 7, wherein the formation of a top layer of a memory device is presented.

Turning to FIGS. 6–8, an exemplary system and process for constructing a planar polymer memory device is illustrated in accordance with an aspect of the present invention. In each figure, the middle diagram provides a three-dimensional perspective view. The top diagram illustrates a cross sectional view from the three-dimensional perspective along line 2—2, viewing from the Z– to Z+ direction from the XY plane. The bottom diagram is also cross sectional view from the three-dimensional perspective from the XY plane; however, it presented is an opposing view (Z+ to Z–) along line 3—3.

Beginning at FIG. 6, a dielectric 605 is utilized as a base for a system 600. The dielectric 605 (e.g., Inter Layer Dielectric (ILD)) can be various dielectric materials such as semiconductor material and/or substantially any type material having dielectric properties. In the figure, the dielectric 605 is shown as a block. It can be appreciated that the illustration is for explanatory purposes and other representations can be acceptable. For example, the base may constructed from more than one dielectric material and/or form a non-uniform (e.g., thickness) volume.

A section of the dielectric layer 605 is removed to create a channel 610 in which an electrode will be formed. Within the channel 610, an optional barrier 615 can be utilized to mitigate diffusion of the lower electrode into an adjacent material, for example the dielectric 605. As an example, the optional barrier can be formed as a metallic (e.g., tantalum) diffusion barrier. Other materials that can be employed as a barrier include cobalt, chromium, nickel, palladium, tantalum, tantalum silicon nitride, titanium, titanium nitride, silicon nitride, tungsten nitride, and tungsten silicon nitride, for example.

A bit line 620 (e.g., lower electrode) cooperating as one of two electrodes for the system 600 is formed within the channel 610 and on top of the barrier 615. The cross sectional views show the exemplary barrier 615 as a three sided channel. However, other configurations such as semicircular having varying degrees of channel thickness can be employed. In addition, bit line 620 is portrayed as even with the surface of the dielectric 605. It can be appreciated that the surface may also be recessed or situated above the surface of the dielectric 605.

Continuing at FIG. 7, construction of a next layer is illustrated in accordance with an aspect of the present invention. As depicted, a dielectric 625 is applied above the dielectric 605, the channel 610 and the lower electrode 620.

A via or other type of opening is formed within the dielectric 625 for word line 630, a bit plug 635 and a passive element 640. The via, if employed, can be formed in accordance with a lithographic etch technique, for example, and/or other process for removing portions of the dielectric 625.

The word line 630 (e.g., upper electrode) is typically a metal material. Other suitable word line materials include Tungsten (W), Thallium (Ti), Thallium Nitride (TiN) and aluminum (Al), for example. The word line 630 is recessed within the dielectric 625 with at last one surface exposed and the remaining unexposed surfaces separated from the lower electrode 620 through a non-conductive medium. In other aspects of the present invention, the word line 630 may be formed on top of the dielectric 625 and may be cylindrical or other three-dimensional shapes. Furthermore, a barrier(s) similar to the one employed with the lower electrode 620 may be utilized with the word line 630. The location of the word line 630 may vary as long as an electrical current path can be established from the word line 630 through a semiconductor material to the bit line 620.

A bit plug 635 (e.g., copper (Cu)) is formed within a via producing an extension of the bit line 620 that protrudes through the dielectric 625. The bit plug 635 can be formed within the dielectric that the word line 630 was formed, and operatively contacts the bit line 635. In addition, the surface of the bit plug 635 opposite to the side contacting the bit line 620 can be a greater, equal or lesser distance from the interface between the dielectric 605 and the dielectric 625 than the word line 630. As previously noted, the bit plug 635 may be integral to or integrated with the bit line 620.

A passive element 640 (e.g., $Cu_2S$) is formed on the surface of the bit plug 635. The passive element 640 can reside over (as illustrated) and/or below the dielectric 625 surface. In addition, the shape of the passive element 640 does not have to be the same shape as the bit plug 635. For example, the bit plug 635 could be rectangular as shown and the passive element 640 could be circular. However, the passive element 640 generally covers the surface of the bit plug 635. Similar to the bit plug 635, the passive element 640 is also separated (e.g. no physical contact) from the word line 630 through a non-conductive medium.

FIG. 8 is a continuation of FIG. 7 illustrating a third layer of the system 600. A polymer 645 is spun-on, covering the passive element 640, a portion of the word line 630 and a portion of the dielectric 625. The polymer 645 provides a selectively conductive interface between the passive element 640 and the word line 630, thereby establishing an a path for electrons through the bit line 620, the bit plug 635, the passive element 640, the polymer 645 and the word line 630. An optional hard mask 650 provides a coating over the organic polymer 645. The hard mask can be any suitable material known in the art such as alpha-carbon (α-C), silicon nitride (SiN) and silicon oxynitride (SiON), for example.

The exemplary systems presented above can further include components to facilitate programming the organic semiconducting materials employed. Examples of suitable components embrace a thin film diode (TFD), a zener diodes, a light emitting diodes (LED), a transistor, a thin-filmed transistor (TFT), a silicon controlled rectifier (SCR), a uni-junction transistor (UJT), a field effect transistor (FET) and the like. For sake of brevity, the following discussion will entail the integration of a thin film diode (TFD).

Figure 9:
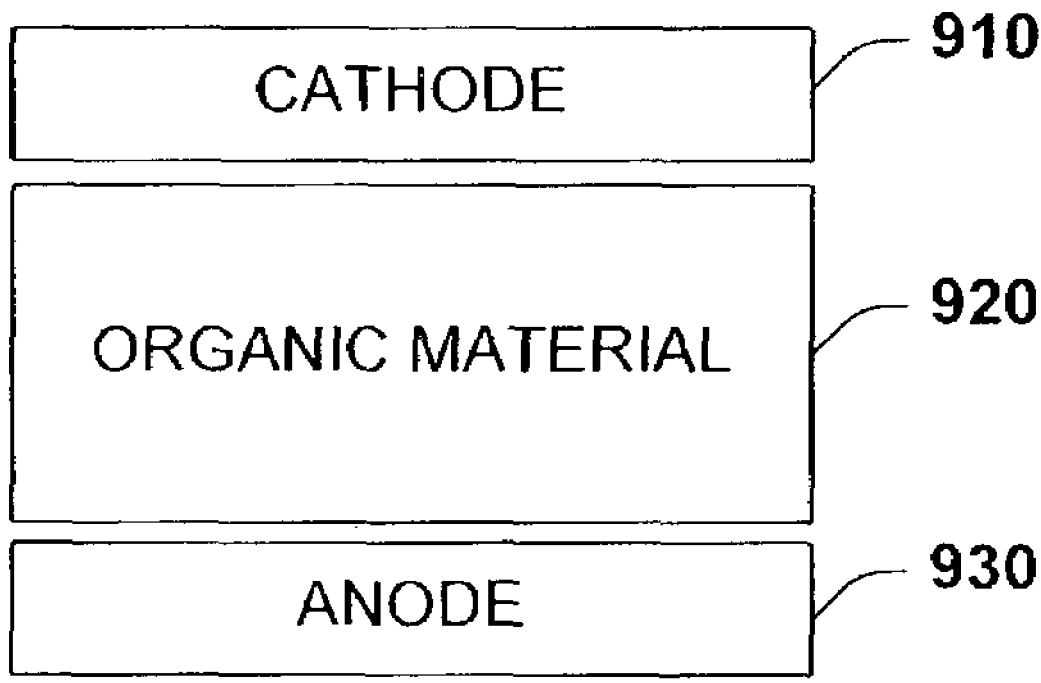
FIG. 9 illustrates an architecture of a basic TFD component that can be employed with a planar polymer memory device in an aspect of the present invention.

Turning to FIG. 9, a block diagram of a basic thin film diode (TFD), which can be integrated with a memory device, for example a planar polymer memory device, is illustrated in accordance with an aspect of the present invention. A TFD 900 includes a conductive cathode 910, a selectively conductive organic material 920 (e.g., polymer film) and a conductive anode 930, wherein cathode 910 and anode 930 are utilized as electrodes.

Applying a forward or positive bias voltage on anode 940 with respect to cathode 920 causes current to flow in a forward direction. With a reverse bias voltage, current flow is typically minimized, unless the reverse bias voltage is increased beyond the breakdown threshold. Thus, for example, by integrating TFD 900 with planar polymer memory device, for example planar polymer memory device 300 of FIG. 3, and controlling the forward and reverse voltages applied to TFD 900 (or other control element such as a transistor), programming and access can be provided to the associated organic memory structure. In another regard, TFD 900 can provide isolation/separation between respective layers. Therefore, TFD 900 can be used to facilitate programming and/or access in one direction by being biased in a forward direction, and in a reverse direction, bias voltages can be applied such that the diode breaks down such as in a zener condition to facilitate programming/access to the organic memory device in the opposite direction.

It is to be appreciated that although various exemplary layers are illustrated in TFD 900, other layers may be formed and/or provided in accordance with the present invention. For example, such layers can include Inter Layer Dielectrics (ILD), barrier layers, coatings, and/or combinations of layers/other elements that cooperate to form structures and/or partitioning components in accordance with the present invention which includes alternative layers and/or elements that are described in more detail below.

Figure 10:
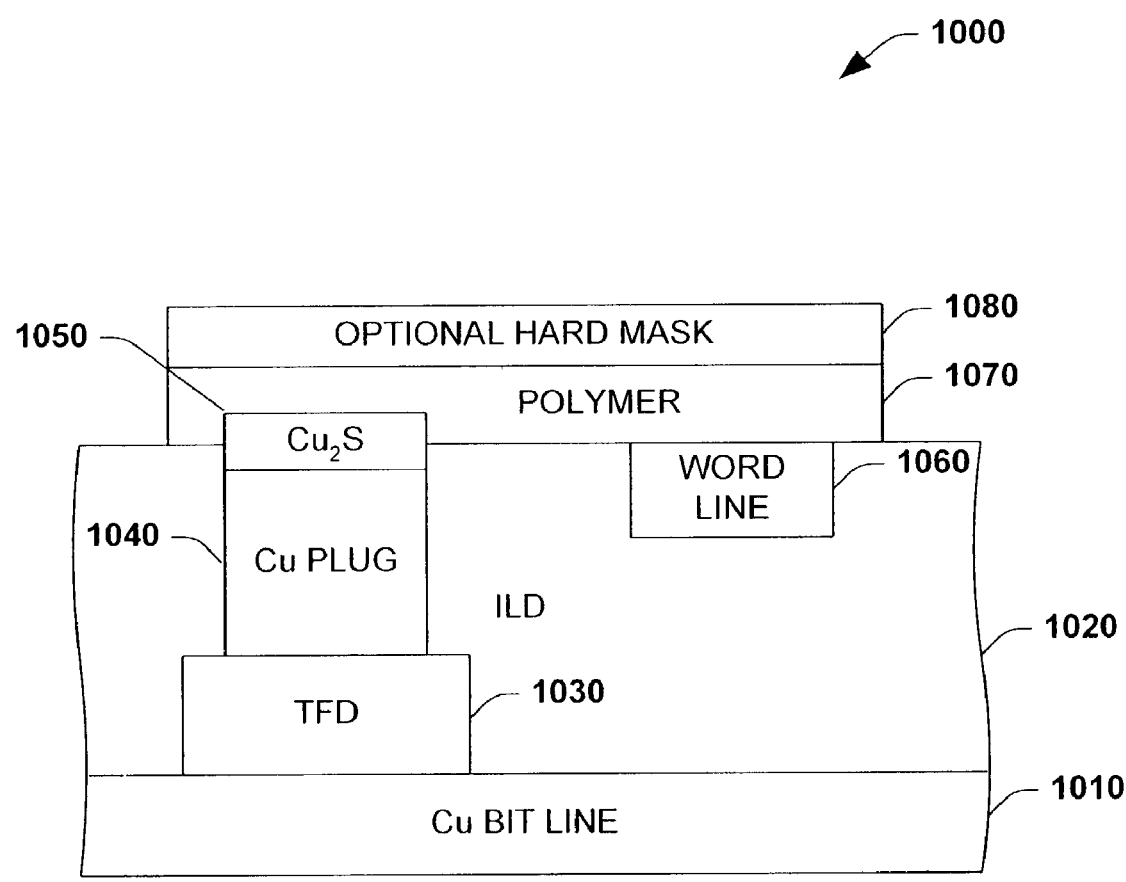
FIG. 10 depicts a first exemplary planar polymer memory device employing a TFD in accordance with an aspect of the present invention.
Figure 11:
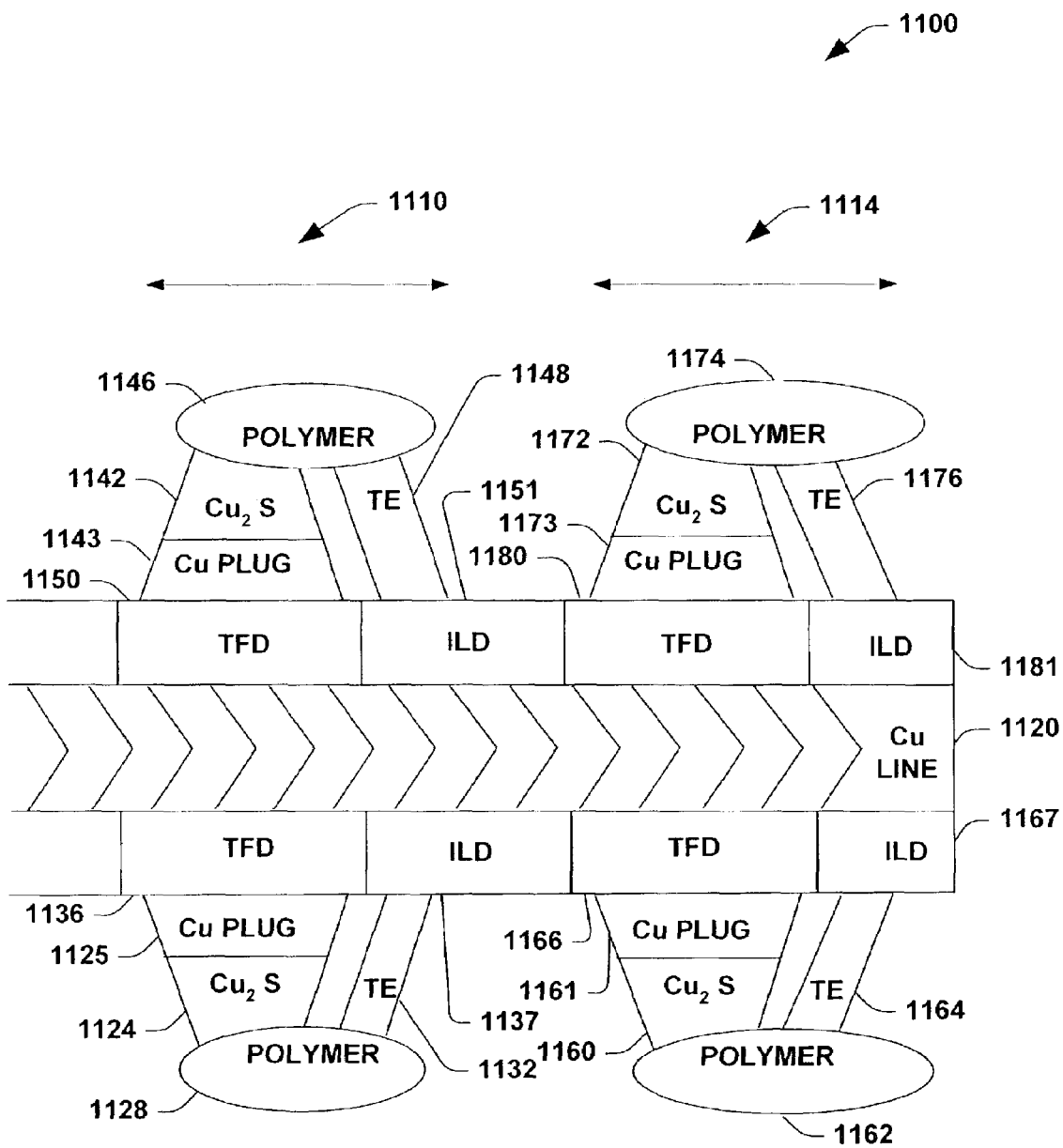
FIG. 11 presents an exemplary stacked planar polymer memory device in accordance with an aspect of the present invention.
Figure 12:
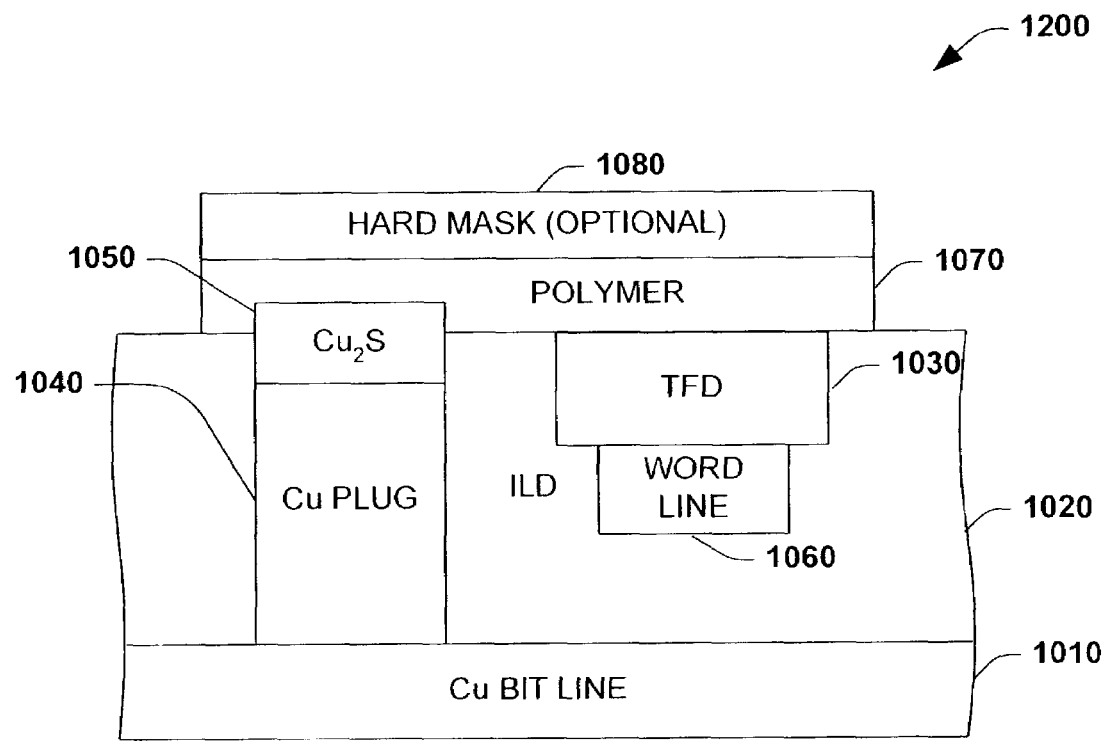
FIG. 12 illustrates two exemplary planar polymer memory devices employing a TFD in accordance with an aspect of the present invention.
Figure 12:
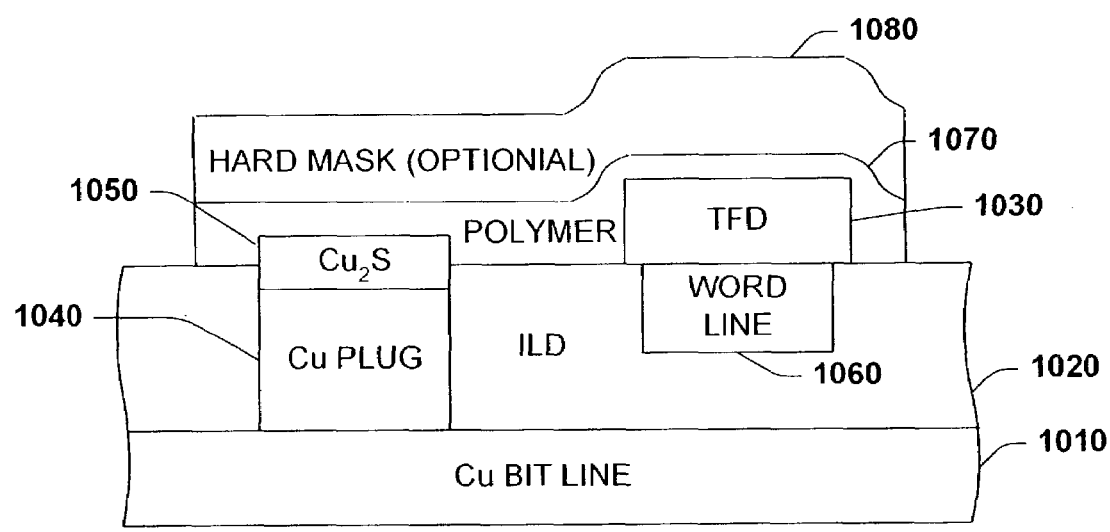

As an example, FIGS. 10–12 depict alternative methods of employing a TFD 900 with exemplary planar polymer memory device. It is noted that the examples are not all inclusive and do not limit the invention. In addition, like structures are employed in the figures wherein like reference numerals refer to like structures. Furthermore, the process described below may be similar to those presented earlier, but are not limited thereto, and in addition, they do not restrict the scope of the present invention. Again, it is noted that integrating a TFD can facilitate programming of a selectively conductive polymer.

Beginning with FIG. 10, a system 1000 is illustrated in accordance with an aspect of the invention. System 1000 includes a Cu bit line 1010, an ILD 1020, a TFD 1030, a Cu bit plug 1040, a passive $Cu_2S$ layer 1050, a word line 1060, a polymer 1070 and an optional hard mask 1080.

The Cu bit line 1010 is formed as a bottom layer conductive electrode. The ILD 1020 can then be formed above the Cu bit line 1010. A via or other type opening can be created and occupied by the TFD 1030, a Cu bit line plug 1040 and a passive $Cu_2S$ layer 1050, for example connected in series from the Cu bit line 1010 to about the opening of the via.

FIG. 11 is a diagram illustrating a stacked memory device 1100 in accordance with an aspect of the present invention. The stacked memory device 1100 depicts two vertical columns 1110 and 1114, wherein respective columns include two layers of organic memory cells. It is to be appreciated that the stacked memory device 1100 is exemplary in nature in that two columns and layers are illustrated, however, a plurality of such columns and/or layers (number of layers do not need to match number of columns) can be provided. It is further to be appreciated that alternative materials from that shown in the examples above can be employed to form the stacked memory device 1100 and are described in more detail below. The stacked memory device 1100 can be constructed in accordance with a damascene/via approach.

The following discussion is related to the vertical column 1110, and can be applied to the vertical column 1114. A TFD 1150 and an ILD 1151 is formed on Cu line 1120. A Cu bit line plug 1143 with a $Cu_2S$ passive layer 1142 is formed over the TFD 1150. Serially and/or concurrently, an electrode 1148 is formed over the ILD 1151. Subsequently, a polymer 1146 is deposited over the $Cu_2S$ passive coating 1142 and the electrode 1148, forming a memory structure. A second memory structure can be similarly constructed utilizing the copper line 1120 (or another copper line), a TFD 1136, an ILD 1137, a Cu plug 1125 with a $Cu_2S$ passive layer 1124, an electrode 1132, and a polymer layer 1128. The vertical column at 1114 is similarly constructed from components 1160–1181.

Turning to FIG. 12, a system 1200 illustrating the system 1000 utilizing two alternative locations for the TFD 1030 is presented in accordance with an aspect of the subject invention. In the top diagram, after the ILD 1020 is formed, a via and/or opening is created to house both the word line 1060 and the TFD 1020. The word line 1060 is formed within the opening as previously described. Then, the TFD 1020 is formed such that it is operatively coupled and in series with the word line 1060, and within the ILD 1020.

In the bottom diagram, a via and/or opening is created in the ILD 1020 for the word line 1060. After the word line 1060 is incorporated into the via and/or opening, the TFD 1210 is formed above and in contact with the word line 1060 and the ILD 1020. The polymer 1070 is then deposited on the surface. In one aspect of the invention, the thickness of the polymer 1070 is about 300 Å–5000 Å. Optionally, a top hard mask (e.g., resist) 1080 is then deposited on the polymer 1070. An antireflective coating (ARC) (not shown) can also be deposited thereon to improve the reflectivity of the collective stack.

Figure 13:
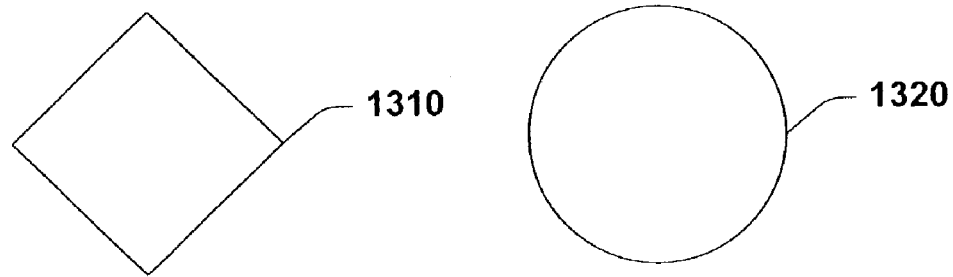
FIG. 13 portrays several alternative architectural shapes that can be utilized with memory device structures in accordance with an aspect of the present invention.
Figure 13:
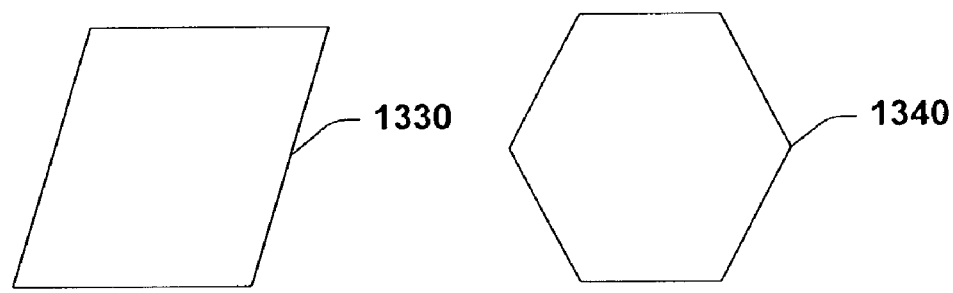
Figure 13:
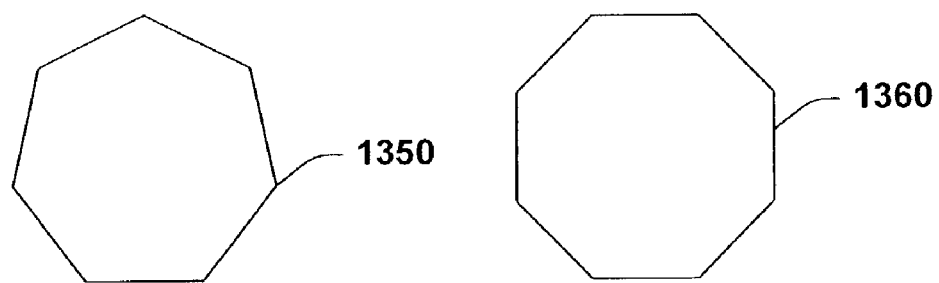

The illustrations above portray the various structures of a planar polymer memory device as two dimensional rectangles and ellipses, or as envisioned in the three dimensional domain, mainly as rectangular parallelepipeds. However, the invention is not limited as such. Turning to FIG. 13, a plurality of variously shaped structures for an organic memory cells are illustrated in accordance with an aspect of the present invention. The structures are presented in a two dimensional plane, however their three dimensional counterpart as well as other suitable shapes may be employed. The figure illustrates a top view of a diamond structure 1310, a circular structure 1320, a trapezoidal (e.g., rhombus) structure 1330, a hexagonal structure 1340, a heptagonal structure 1450, and an octagonal structure 1460.

FIGS. 14–18 illustrate alternative materials and processes that may be employed in accordance with an aspect of the present invention. Accordingly, such components that have been previously described such as electrodes, conductive materials, passive layers, organic materials/layers, and processes for fabricating the same will now be described in more detail and in accordance with alternative aspects of the present invention.

Figure 14:
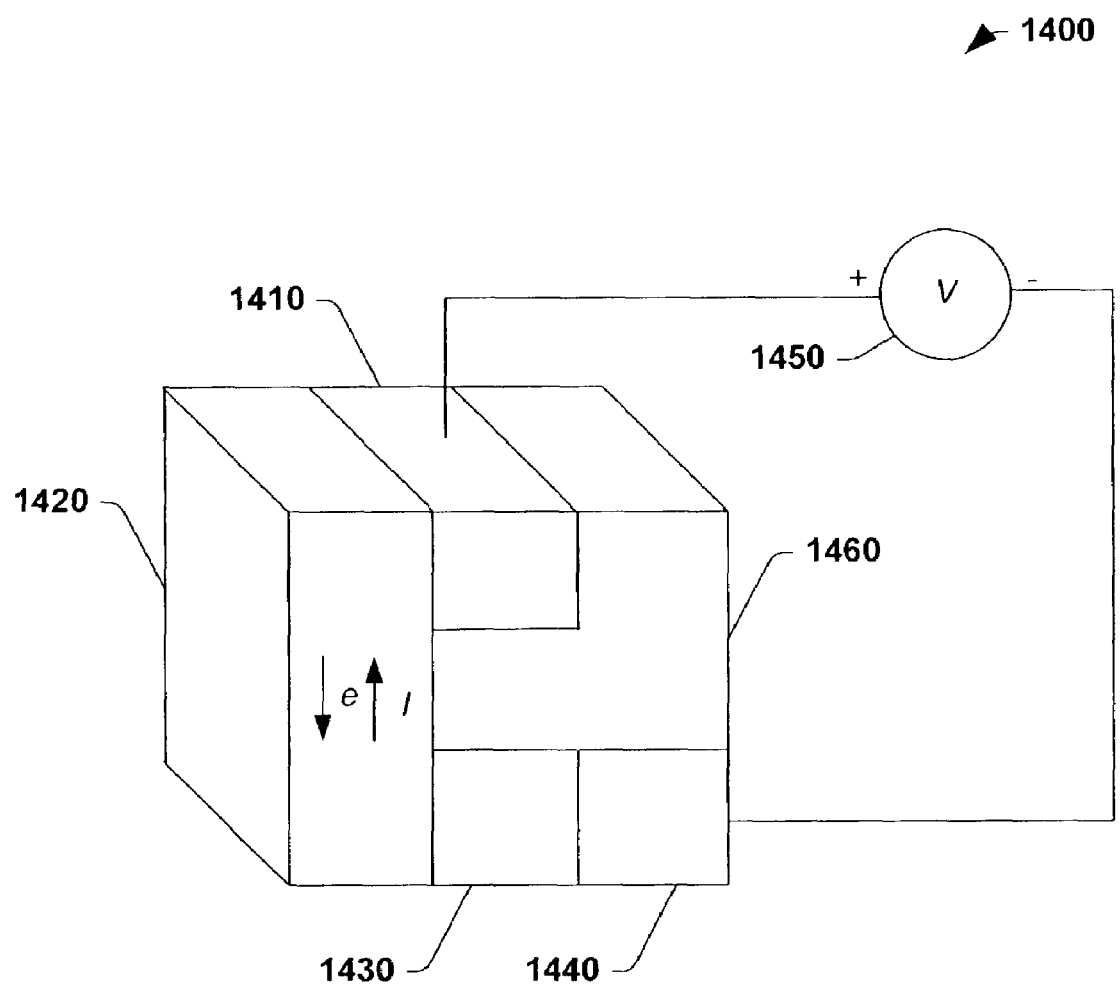
FIG. 14 demonstrates an exemplary operation of a memory device in accordance with an aspect of the present invention.

Referring to FIG. 14, a three-dimensional diagram of an organic memory device 1400 in accordance with an aspect of the present invention is depicted. The memory device includes a first electrode 1410, an organic polymer material 1420, a passive structure 1430, a second electrode 1440 and a barrier 1460 between first electrode 1410, and passive structure 1430 and second electrode 1440. The diagram also illustrates a voltage source 1450 connected to the first electrode 1410 and the second electrode 1440 that applies a voltage across the first electrode 1410 and the second electrode 1440. For illustrative purposes, a single first electrode is described.

The first electrode 1410 and the second electrode 1440 are comprised of a conductive material such as, copper, copper alloy, or silver alloy. Other materials can be aluminum, chromium, germanium, gold, magnesium, manganese, indium, iron, nickel, palladium, platinum, titanium, zinc, alloys thereof, indium-tin oxide, polysilicon, doped amorphous silicon, metal silicides, and the like. Exemplary alloys that can be utilized for the conductive material include copper-silver alloy, copper-zinc alloy. Other materials can be Hastelloy®, Kovar®, Invar, Monel®, Inconel®, brass, stainless steel, magnesium-silver alloy, and various other alloys.

The thickness of the first electrode 1410 and the second electrode 1440 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 1420 and the passive layer 1430 are collectively referred to as a selectively conductive media or selectively conductive layer. The conductive properties of this media (e.g., conductive, non-conductive, semi-conductive) can be modified in a controlled manner by applying various voltages across the media via the electrodes 1410 and 1440.

The organic layer 1420 is comprised of a conjugated organic material. If the organic layer is polymer, a polymer backbone of the conjugated organic polymer may extend lengthwise between the electrodes 1410 and 1440. The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polypyrroles; and the like. Additionally, the properties of the organic material can be modified by doping with a suitable dopant (e.g., salt).

The organic layer 1420 has a suitable thickness that depends upon the chosen implementations and/or the memory device being fabricated. Some suitable exemplary ranges of thickness for the organic polymer layer 1420 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 1420 can be formed via a number of suitable techniques. One suitable technique that can be utilized is a spin-on technique, which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. It may have a chemical bond formed between the conjugated organic polymer and the passive layer 1430.

The passive layer 1430 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 1420. The particular conductivity facilitating compound employed is selected so that the two relatively stable states match with the two relatively stable states of the conjugated organic molecule of the layer 1420.

The passive layer 1430 can in some instances act as a catalyst when forming the organic layer 1420. In this connection, the backbone of the conjugated organic molecule may initially form adjacent the passive layer 1430, and grow or assemble away and substantially perpendicular to the passive layer surface. As a result, the backbones of the conjugated organic molecule may be self-aligned in a direction that traverses the two electrodes.

Examples of conductivity facilitating compounds that may make up the passive layer 1430 include chalcagonide glasses comprising one or more of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), gold sulfide ($Au_2S$, AuS), cerium sulfate ($Ce(SO_4)_2$), ammonium persulfate ($(NH_4)_2S_2O_8$), iron oxide ($Fe_3O_4$), lithium complexes ($Li_xTiS_2$, $Li_xTiSe_2$, $Li_xNbSe_3$, $Li_xNb_3Se_3$), palladium hydride ($H_xPd$) (where x and y are selected to produce desired properties), and the like. The passive layer 1430 may be grown using oxidation techniques, formed via gas phase reactions, or deposited between the electrodes.

The passive layer 1430 has a suitable thickness that can vary based on the implementation and/or memory device being fabricated. Some examples of suitable thicknesses for the passive layer 1430 are as follows: a thickness of about 2 Å or more and about 0.1 µm or less, a thickness of about 10 Å or more and about 0.01 µm or less, and a thickness of about 50 Å or more and about 0.005 µm or less.

In order to facilitate operation of the organic memory device, the organic layer 1420 is generally thicker than the passive layer 1430. In one aspect, the thickness of the organic layer is from about 0.1 to about 500 times greater than the thickness of the passive layer. It is appreciated that other suitable ratios can be employed in accordance with the present invention.

The inter layer dielectric (ILD) layer 1460 can be a semiconductor material, for example, and/or substantially any type material having dielectric properties. It can act as a barrier between first electrode 1410 and passive layer 1430/second electrode 1440 such that the electrical current flow follows that path through the first electrode 1410, organic layer 1420, passive layer 1430 and second electrode 1440 when a forward bias voltage is applied.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance-state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 1440 through the selectively conductive media to the first electrode 1410 based on a voltage applied to the electrodes by the voltage source 1450 if the organic layer is n-type conductor. Alternately, holes flow from the first electrode 1410 to second electrode 1440 if the organic layer 1420 is p-type conductor, or both electrons and holes flow in the organic layer if it can be both n and p type with proper energy band match with 1430 and 1440. As such, current flows from the first electrode 1410 to the second electrode 1440 via the selectively conductive media.

Switching the organic memory device to a particular state is referred to as programming or writing. Programming is accomplished by applying a particular voltage (e.g., 0.9 volts, 0.2 volts, 0.1 volts, . . . ) across the selectively conductive media via the electrodes 1410 and 1440. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory device, the thickness of the various layers, and the like. The voltage supply 1450 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 1 volts, 0.5 volts, 0.1 volts) is applied via the voltage source 1450. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Figure 15:
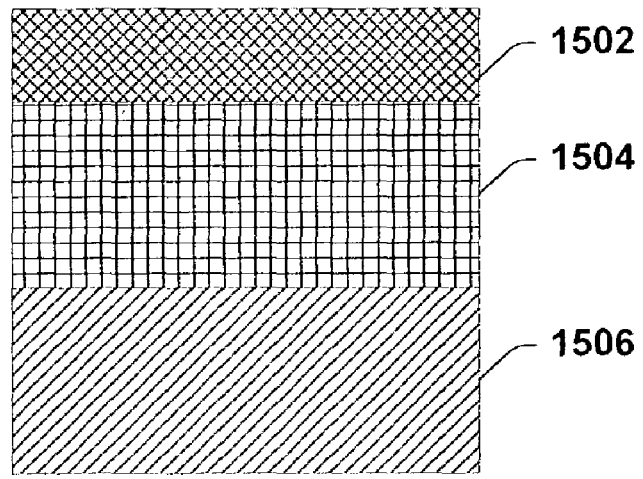
FIG. 15 is a block diagram of a passive layer that can be employed in an organic memory device in accordance with an aspect of the present invention.

FIG. 15 is a block diagram that depicts fabrication of a passive layer 1500 in accordance with an aspect of the present invention. A $Cu_{2-x}S_y$ layer is formed by a gas phase reaction operation. A first layer 1506 is formed that comprises Cu. A second layer 1504 is formed on the first layer. The second layer comprises $Cu_{2-x}S_y$ (e.g., $Cu_{2-x}S_y$, CuS or mixture thereof) and has a thickness of about 20 Å or more. A third layer 1502 is formed on the second layer 1504. The third layer 1502 contains $Cu_2O$ and/or CuO and generally has a thickness of about 10 Å or less. It is appreciated that alternate aspects of the invention can employ suitable variations in composition and thickness and still be in accordance with the present invention.

Figure 16:
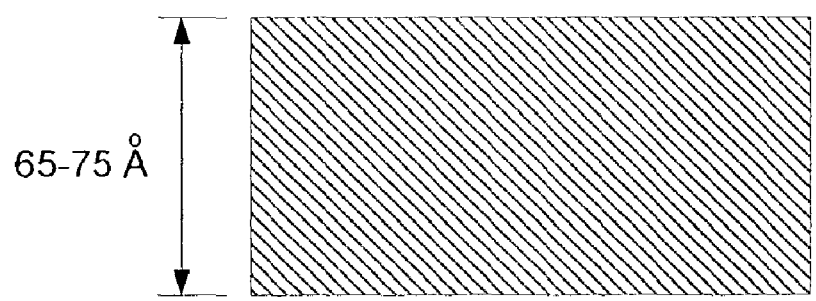
FIG. 16 is a block diagram illustrating an organic polymer layer formed by a CVD process in accordance with an aspect of the present invention.

FIG. 16 is a block diagram illustrating an organic layer 1600 formed by a chemical vapor deposition (CVD) process in accordance with an aspect of the present invention. The organic layer 1600 is formed via a gas phase reaction process. Typically, the organic layer 1600 is formed in contact with a passive layer and an electrode. The organic layer 1600 is comprised of polymer polydiphenylacetylene (DPA). This polymer layer, as shown in FIG. 14, is fabricated to be about 65–75 Å thick.

Figure 17:
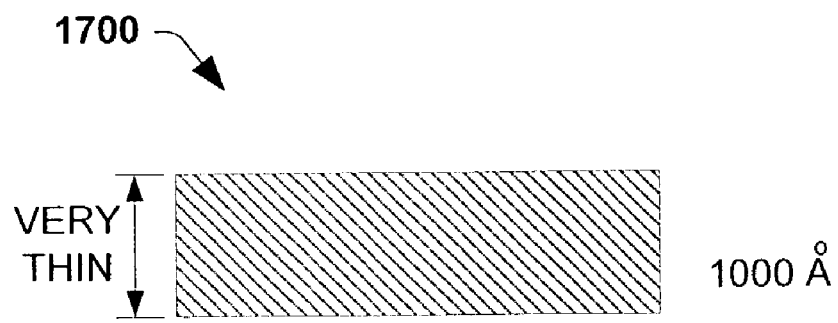
FIG. 17 is a block diagram illustrating another organic polymer layer formed by a CVD process in accordance with an aspect of the present invention.
Figure 18:
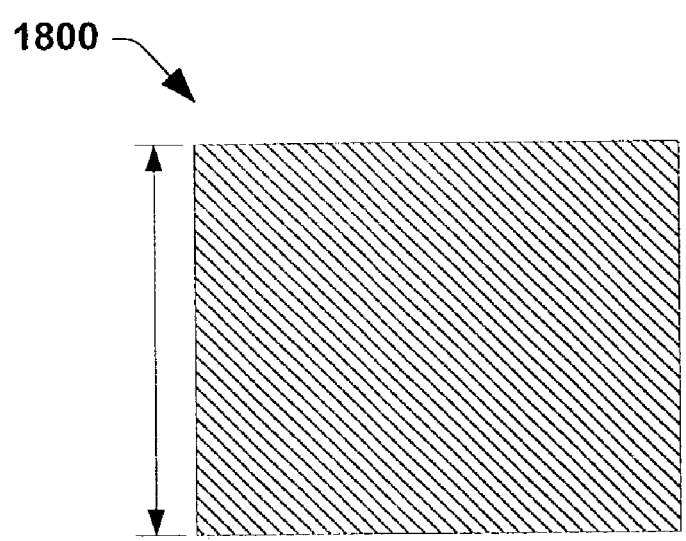
FIG. 18 is a block diagram of yet another organic polymer layer formed by a CVD process in accordance with an aspect of the present invention.

Turning now to FIG. 17, a block diagram depicting another organic layer 1700 formed from a CVD process in accordance with an aspect of the present invention is illustrated. Once again, the organic layer 1700 is formed via a gas phase reaction process. The organic layer 1700 is formed in contact with a passive layer and an electrode. The organic polymer layer 1700 is comprised of polymer polyphenylacetylene (PPA). Referring to FIG. 18, a block diagram of another organic layer 1800 formed by spin coating in accordance with an aspect of the present invention is illustrated. The organic layer 1800 is formed via a spin coating process, instead of a gas phase reaction process. The organic layer 1800 is formed in contact with a passive layer and an electrode. The organic layer 1800 is comprised substantially of PPA and has a thickness of about 1000 Å. It is appreciated that various alternatives to and variations of the layers described in FIGS. 14–18 can be employed in accordance with the present invention.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in the detailed description and the claims, such term is intended to be inclusive in a manner similar to the term "comprising."

What is claimed is:

1. An organic memory device, comprising:
   an organic semiconductor layer to store information;
   a passive layer operative with the organic semiconductor layer to facilitate storage of the information, the passive layer comprising a conductivity facilitating compound that donates and accepts charges; and
   a first electrode and a second electrode to access the organic semiconductor layer, the organic semiconductor layer positioned above the first electrode and the second electrode, one of the first electrode and second electrode accessing the organic semiconductor layer through the passive layer.

2. The memory device of claim 1, the organic semiconductor and passive layers are stacked in a horizontal manner.

3. The memory device of claim 1, the organic semiconductor and passive layers are shaped in various geometric patterns including at least one of a square structure, a rectangular structure, an elliptical structure, a circular structure, a pyramidal structure, a polygonal structure, trapezoidal structure, a diamond structure, an "L" shaped structure, and a trapezoidal structure.

4. The memory device of claim 3, the geometric patterns comprise rectangular structures.

5. The memory device of claim 1, further comprising a barrier layer to provide isolation between layers.

6. The memory device of claim 1, at least one of the layers is formed in accordance with a damascene process.

7. The memory device of claim 1, at least one of the layers is formed in accordance with a stacked pillar process.

8. The memory device of claim 1, further comprising at least one of a diode, a thin-filmed diode (TFD), a zener diode, an LED, a transistor, a thin-filmed transistor (TFT), a Silicon Controlled Rectifier (SCR), Uni Junction Transistor (UJT), and a Field Effect Transistor (FET) to facilitate access to the layers.

9. The memory device of claim 8, the TFD is an organic device having a polymer layer formed between a cathode electrode and an anode electrode.

10. The memory device of claim 1, further comprising one or more global access lines to facilitate access to a plurality of organic memory structures formed within the integrated memory device.

11. The memory device of claim 1, the organic semiconductor layer comprising an organic polymer.

12. The memory device of claim 1, the passive layer comprising a plurality of individual passive layers.

13. The memory device of claim 12, the passive layer comprising a chalcogenide glass such as copper sulfide.

14. The memory device of claim 11, the organic semiconductor layer comprising a conjugated organic polymer.

15. The memory device of claim 1, the organic semiconductor layer comprising at least one selected from the group consisting of: polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polypyrroles.

16. The memory device of claim 1, at least one of the first electrode and the second electrode comprising a material selected from the group consisting of aluminum, chromium, copper, germanium, gold, magnesium, manganese, indium, iron, nickel, palladium, platinum, silver, titanium, titanium nitride, tungsten, zinc, alloys thereof, indium-tin oxide, polysilicon, doped amorphous silicon, and metal silicides.

17. The memory device of claim 16, further comprising a barrier layer positioned between at least one electrode and an adjacent dielectric to mitigate diffusion of the at least one electrode into the adjacent dielectric.

18. The memory device of claim 17, the barrier layer comprising at least one of cobalt, chromium, nickel, palladium, tantalum, tantalum silicon nitride, titanium, titanium nitride, silicon nitride, tungsten nitride, and tungsten silicon nitride.

19. The memory device of claim 16, at least one of the first electrode and the second electrode formed in accordance with at least one of a single damascene process and a dual damascene process.

20. The memory device of claim 1, the layers forming a non-volatile memory device employed as component in a computer system.

21. The memory device of claim 1, at least one of the organic semiconductor layer, the passive layer, the first electrode layer and the second electrode layer form an extension into a subsequent layer.

22. The memory device of claim 1, further comprising at least one other organic semiconductor layer, the at least one other organic semiconductor layer operating in at least one of a similar plane and a different plane from the organic semiconductor layer.

23. An organic memory device, comprising:
   a lower electrode layer extending into a dielectric layer;
   a passive layer associated with the lower electrode, the passive layer comprising a conductivity facilitating compound that donates and accepts charges;
   an organic semiconductor layer operative with the passive layer to store data; and
   a second electrode extending into the dielectric material, the second electrode operative with the first electrode and the passive layer to at least one of store and access the data in the organic semiconductor layer.

24. The memory device of claim 23, the conductivity facilitating compound comprises at least one of copper sulfide, silver sulfide, gold sulfide, ammonium persulfate, palladium hydride, a lithium complex, and a silver-copper sulfide complex.

25. The memory device of claim 23, the conductivity facilitating compound comprises copper sulfide.

26. The memory device of claim 1, the conductivity facilitating compound comprises at least one of copper sulfide, silver sulfide, gold sulfide, ammonium persulfate, palladium hydride, a lithium complex, and a silver-copper sulfide complex.

27. An organic memory device, comprising:
- an organic semiconductor layer comprising a conjugated organic polymer to store information;
- a passive layer operative with the organic semiconductor layer to facilitate storage of the information, the passive layer comprising a conductivity facilitating compound comprising at least one of copper sulfide, silver sulfide, gold sulfide, ammonium persulfate, palladium hydride, a lithium complex, and a silver-copper sulfide complex; and
- a first electrode and a second electrode to access the organic semiconductor layer, the organic semiconductor layer positioned above the first electrode and the second electrode, one of the first electrode and second electrode accessing the organic semiconductor layer through the passive layer.

28. The memory device of claim 1, the conductivity facilitating compound comprises copper sulfide.

* * * * *